(12) United States Patent
Lee et al.

(10) Patent No.: US 7,143,815 B2
(45) Date of Patent: Dec. 5, 2006

(54) LIQUID COOLING DEVICE

(75) Inventors: Hsieh-Kun Lee, Tu-Cheng (TW);
Cheng-Tien Lai, Tu-Cheng (TW);
Zhi-Yong Zhou, Shenzhen (CN)

(73) Assignee: Foxconn Technology Co., Ltd.,
Tu-Cheng (TW)

( * ) Notice: Subject to any disclaimer, the term of this patent is extended or adjusted under 35 U.S.C. 154(b) by 93 days.

(21) Appl. No.: 11/069,142

(22) Filed: Mar. 1, 2005

(65) Prior Publication Data
US 2005/0241804 A1 Nov. 3, 2005

(30) Foreign Application Priority Data
Apr. 29, 2004 (CN) ............. 2004 2 0045482

(51) Int. Cl.
*H05K 7/20* (2006.01)
(52) U.S. Cl. ............... 165/80.4; 165/104.33; 165/165; 165/104.28; 165/908; 361/699
(58) Field of Classification Search ............... 165/80.4, 165/104.33, 908; 239/601
See application file for complete search history.

(56) References Cited

U.S. PATENT DOCUMENTS

| | | | | |
|---|---|---|---|---|
| 2,323,001 A | * | 6/1943 | Bargeboer | 239/125 |
| 3,088,854 A | * | 5/1963 | Spies, Jr. | 148/194 |
| 3,130,920 A | * | 4/1964 | Devillard | 239/601 |
| 3,921,915 A | * | 11/1975 | Glenn et al. | 239/589 |
| 3,968,931 A | * | 7/1976 | Smith | 239/125 |
| 4,097,000 A | * | 6/1978 | Derr | 239/599 |
| 4,300,723 A | * | 11/1981 | Prasthofer | 239/499 |
| 4,352,392 A | * | 10/1982 | Eastman | 165/104.25 |
| 4,838,041 A | * | 6/1989 | Bellows et al. | 62/51.2 |
| 5,183,104 A | * | 2/1993 | Novotny | 165/104.33 |
| 5,491,363 A | * | 2/1996 | Yoshikawa | 257/715 |
| 5,522,452 A | * | 6/1996 | Mizuno et al. | 165/286 |
| 5,666,269 A | | 9/1997 | Romero et al. | |
| 5,833,148 A | * | 11/1998 | Steinhilber et al. | 239/601 |
| 5,999,404 A | * | 12/1999 | Hileman | 361/699 |
| 6,105,373 A | * | 8/2000 | Watanabe et al. | 62/3.7 |
| 6,349,760 B1 | * | 2/2002 | Budelman | 165/80.4 |
| 6,397,932 B1 | | 6/2002 | Calaman et al. | |
| 6,578,626 B1 | | 6/2003 | Calaman et al. | |
| 6,655,449 B1 | | 12/2003 | Hsien | |
| 2002/0079088 A1 | * | 6/2002 | Agonafer et al. | 165/80.4 |
| 2005/0183844 A1 | * | 8/2005 | Tilton et al. | 165/80.4 |

* cited by examiner

*Primary Examiner*—Allen J. Flanigan
(74) *Attorney, Agent, or Firm*—Morris, Manning & Mart; Tim Tingkang Xia, Esq.

(57) ABSTRACT

A liquid cooling device includes a casing (10) having a container (14) for accommodating liquid therein, and a liquid inlet port (18) in communication with the container (14). A funnel-shaped channel is defined in the liquid inlet port (18), and radiuses of the funnel-shaped channel are descended along a liquid flow direction.

13 Claims, 3 Drawing Sheets

LIQUID COOLING DEVICE

CROSS REFERENCE TO RELATED APPLICATIONS

This application is related to a U.S. patent anpplication Ser. No. 10/950,736, filed Sep. 27, 2004, entitled "Liquid Cooling Device", and a U.S. patent application Ser. No. 11/070,550, filed Mar. 2, 2005, entitled "Liquid Cooling Device". The disclosures of the above identified applications are incoroorated herein by reference.

BACKGROUND OF THE INVENTION

1. Field of the Invention

The present invention relates to a cooling device, and more particularly to a cooling device utilizing liquid for cooling a heat-generating device.

2. Description of Related Art

Liquid cooling devices were commonly utilized to cool huge systems such as furnaces. Today, liquid cooling devices also are used to cool electronic or electrical components, such as chipsets, dies or computer central processing units (CPUs), by circulating the cooling liquid in a channel.

Generally, a liquid cooling device comprises a casing, forming a liquid container made of metal material. The casing comprises a base and a lid covering the base. The base is for contacting a wait-to-be-cooled component. The lid comprises a liquid outlet and a liquid inlet. Liquid pipes respectively connect the liquid outlet and the liquid inlet to a liquid tank. The liquid tank is further provided with a submersible motor therein. In operation to dissipate heat from the cooled component, the liquid in the liquid tank flows through the liquid inlet pipe into the casing, and is drawn by the motor to exit from the casing to the liquid tank for a subsequent circulation.

It is apparent, the liquid inlet is columned-shaped and its inner radius is fixed. As a result, the liquid flows, at a substantially constant speed, through the liquid inlet into the casing. Heat exchange is not sufficient between the fluid and the casing. Heat taken away from the casing by the liquid is limited. So it is difficult to get maximized heat exchange efficiency of the liquid cooling device.

SUMMARY OF THE INVENTION

Accordingly, an object of the present invention is to provide a liquid cooling device getting maximized heat exchange efficiency.

In order to achieve the object set out above, a liquid cooling device in accordance with a preferred embodiment of the present invention comprises a casing having a container for accommodating liquid therein, a liquid inlet port and a liquid outlet port in communication with the container. A funnel-shaped channel is defined in the liquid inlet port, and radiuses of the funnel-shaped channel are descended along a liquid flow direction.

Other objects, advantages and novel features of the present invention will become more apparent from the following detailed description when taken in conjunction with the accompanying drawings, in which:

DETAILED DESCRIPTION OF THE INVENTION

Figure 1:
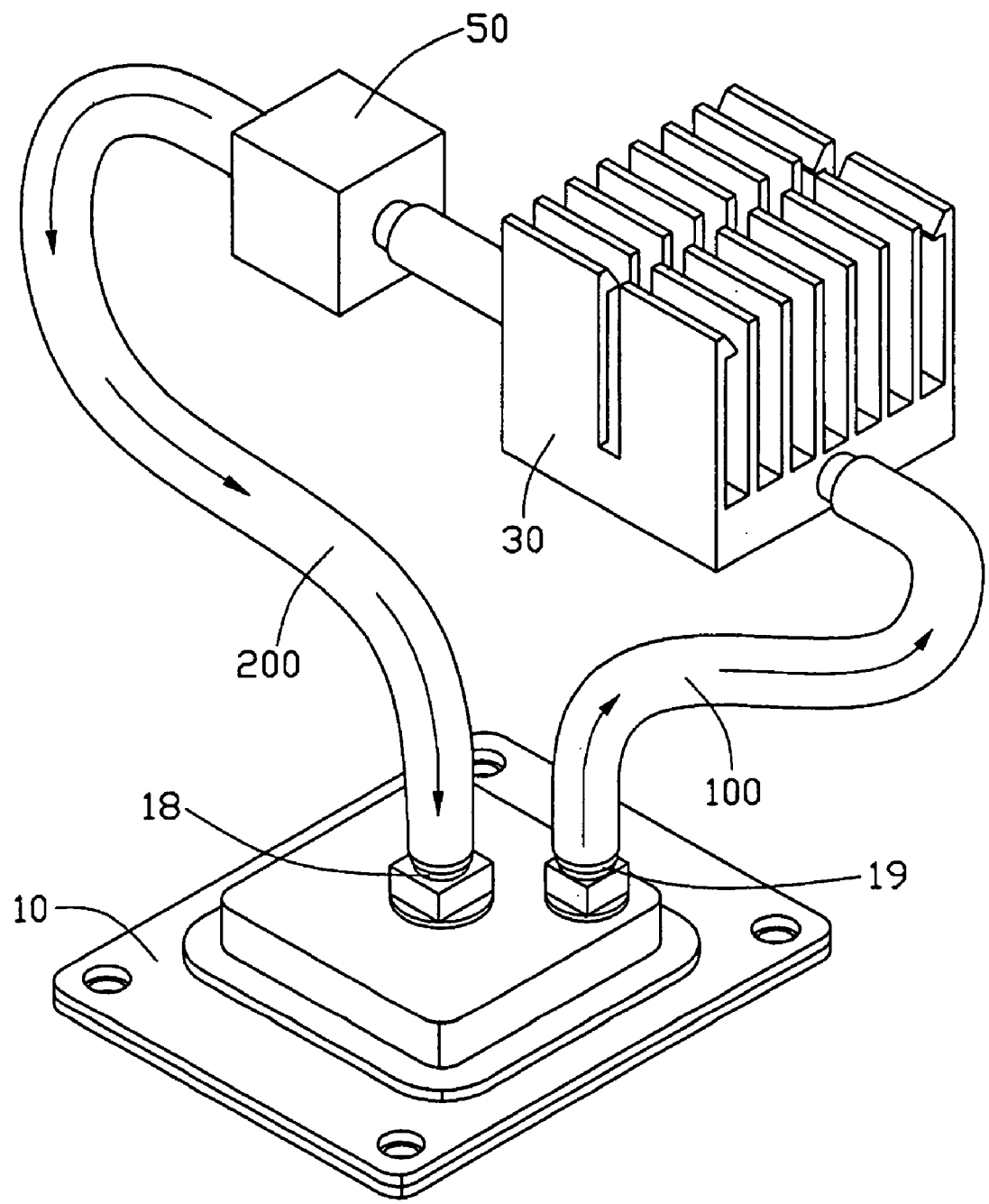
FIG. 1 is an assembled, isometric view of a liquid cooling device in accordance with a preferred embodiment of the present invention.
Figure 2:
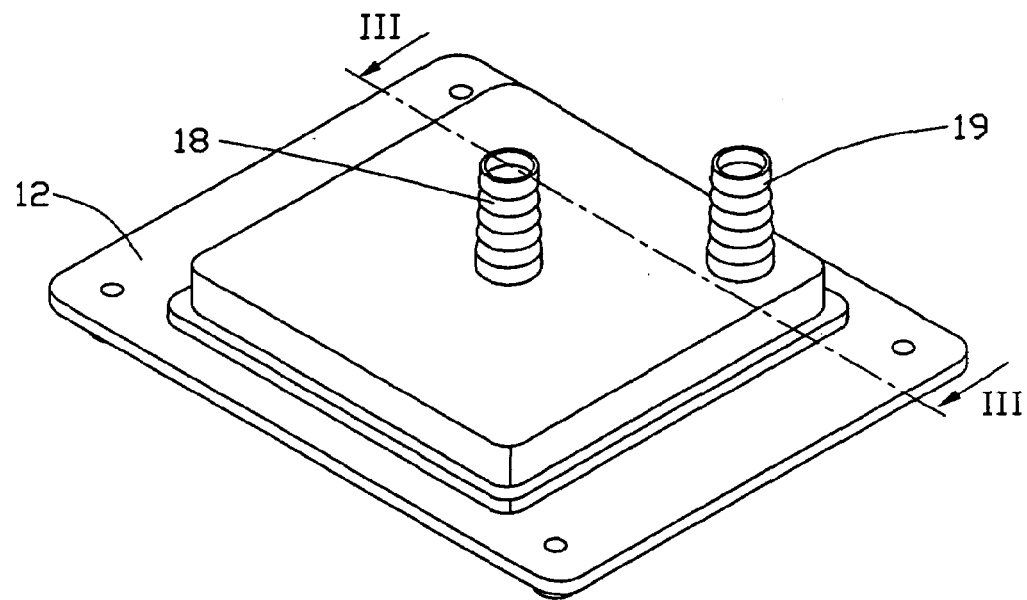
FIG. 2 is a view of a casing of the liquid cooling device of FIG. 1.
Figure 3:
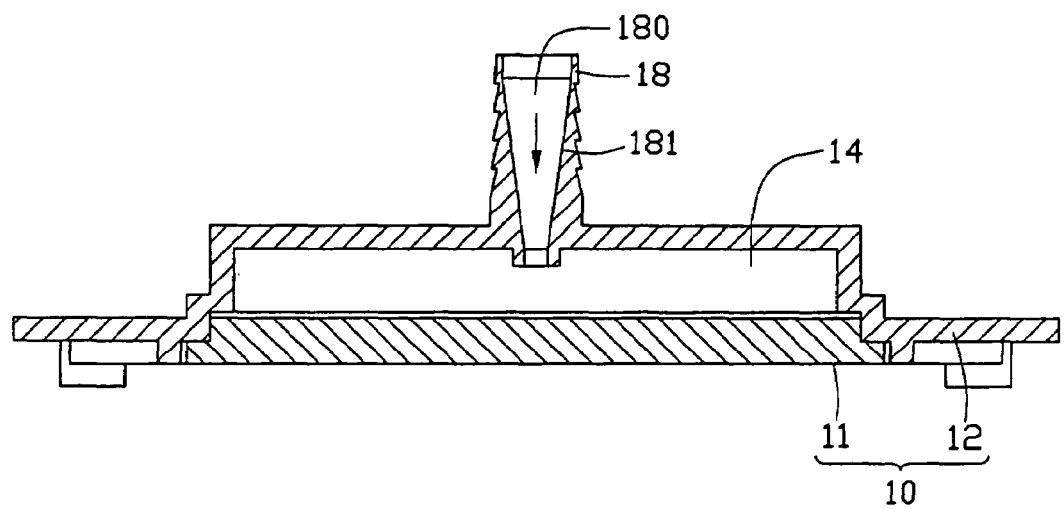
FIG. 3 is a cross-sectional view of FIG. 2, taken along line III—III.

Referring to FIGS. 1–3, a liquid cooling device for a heat-generating component in accordance with a preferred embodiment of the present invention comprises a casing 10, and an actuator 50 connected to the casing 10 by a liquid outlet pipe 100 and a liquid inlet pipe 200 respectively at opposite locations of the actuator 50.

The casing 10 comprises a base 11 for intimately contacting a heat generating component or source (not shown) by a side surface thereof to absorb heat therefrom, and a lid 12 hennetically mounted on the base 11. A protrusion (not labeled) projects upwardly from a central portion of the lid 12 and a flat container 14 is defined in the protrusion of the lid 12 to accommodate liquid for circulation. The lid 12 and the base 11 are assembled together to form the casing 10. The base 11 and the lid 12 are hennetizated by calk, packing, shim, or seal, for keeping the liquid from leaking out of the container 14. A pair of tubular connectors, for connecting the pipes 100, 200 to the casing 10, projects upwardly from the protusion of the lid 12. The connectors are respectively named as liquid inlet port 18 and liquid outlet port 19, according to the directions along which the liquid flows in the connectors. The liquid inlet port 18 and the liquid outlet tort 19 are at the same side of the container 14. The liquid inlet port 18 is disposed at a middle of the lid 12 so that the liquid cooled by the fin member 30 can directly impinge on a central portion of the base 11.

The container 14, the liquid outlet pipe 100, the actuator 50 and the liquid inlet pipe 200 cooperatively define a hermetical circulation route or loop for liquid. The acutator 50 can be a pump, an impeller, a promoter or the like, for actuating liquid to continuosly circulate in the route along the arroww as shown in FIG. 1.

For promoting the cooline efficiency of the device, a radiator is arranged on the liquid circulation route. A fin member 30 is an example of lthe radiator. In the preferred embodiment of the present invention, a portion of the liquide outlet pipe 100 enters into the fin member 30, so that heat, still contained in the liquid after naturally cooled in the casing 10, is removed to the fin member 30 and is dissipated to ambient air. Thus, the liquid is extremely cooled before entering the container 14 for a subsequent circulation. Understandably, a fan (now shown) can be mounted onto the fin member 30 for enhancing heat dissipation capability of the ffin member 30.

In the present invention, the liquid inlet port 18 defines a funnel-shaped inner channel 180 by an inner surface 181 thereof. A height of the channel 180 of the liquid inlet port 18 is higher than that of the container 14. Radiuses of the channel 180 are gradually descended along a direction of the liquid flow, i.e., an arrow direction shown in FIG. 3. The inner surface 181 of the liquid inlet port 18 is a beeline in an axial direction of the channel 180. When the liquid flows within the liquid inlet port 18, the liquid flow speed increases gradually because the radiuses of the channel 180 are descended along the direction of the liquid flow. Thus, a shooting flow is produced when the liquid enters the container 14 through the liquid inlet port 18. The liquid strongly strikes a middle of the base 11. A turbulent flow is produced in the container 14, after the liquid striking the base 11. Heat exchange efficiency between the liquid and the casing 10 is thereby increased, and the liquid extremely absorbs heat from the base 11. Then the liquid flows out from the liquid outlet port 19, taking heat away from the casing 10.

Figure 4:
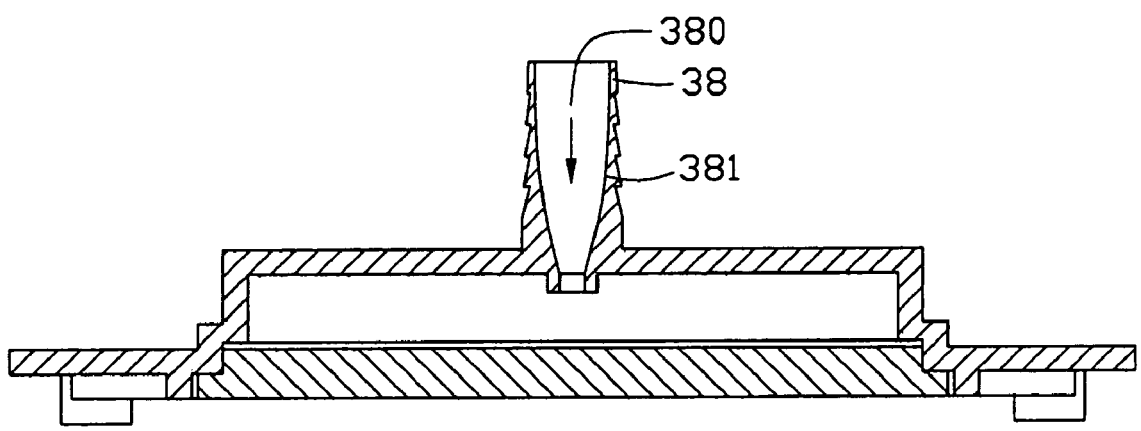
FIG. 4 is a cross-sectional view of a casing of a liquid cooling device in accordance with an alternative embodiment of the present invention.

FIG. 4 shows another type of the liquid inlet port 18, named by liquid inlet portion 38. The liquid inlet portion 38 defines a funnel-shaped inner channel 380 by an inner surface 381 thereof. Radiuses of the channel 380 are gradually descended along a direction of the liquid flow. The inner surface 381 of the liquid inlet portion 38 is concave in an axial direction of the channel 380. It is feasible that the inner surface 381 is convex in the axial direction of the channel 380. Other references about the liquid cooling device using the liquid inlet portion 38 are the same as those about the liquid cooling device using the liquid inlet port 18, and are omitted here.

Generally, heat is collected in a middle of the base 11, so the liquid inlet portion of the liquid cooling device, whether it is the liquid inlet port 18 or the liquid inlet portion 38, is positioned at a middle of the lid 12 corresponding to the middle of the base 11. The liquid flowing through the liquid inlet port 18, or the liquid inlet portion 38 thereby directly strikes the middle of the base 11 to extremely absorb heat from the base 11. Most importantly, a shooting flow is produced when the liquid enters the container 14 through the liquid inlet port 18, or the liquid inlet portion 38. The liquid strongly strikes the middle of the base 11. A turbulent flow is produced in the container 14 after the liquid entering the container 14. Heat exchange efficiency between the liquid and the casing 10 is thereby increased, and the liquid extremely absorbs heat from the base 11.

For showing clearly, the casing 10, the fin member 30 and the actuator 50 are positioned separately, and connected by the 100, 200 in the preferred embodiment of the present invention. However, it is also understood that the fin member 30 can be directly positioned on the casing 10, and the actuator 50 can be positioned within the fin member 30, without the liquid outlet pipe 100 and the liquid inlet pipe 200, to thereby save space occupied by the liquid cooling device.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. A liquid cooling device comprising:
   a casing comprising a heat-absorbing base and a lid hermetically mounted on the base, a protrusion projecting upwardly from the lid and a container being defined in the protrusion of the lid to accommodate liquid for circulation;
   a liquid inlet port and a liquid outlet port being provided at the same side of the protrusion of the lid, the liquid inlet port and the liquid outlet port communicating with the container, through the liquid inlet port the liquid entering the container and through the liquid outlet port the liquid leaving the container, the liquid inlet port defining a funnel shaped channel having radiuses gradually descended along a liquid flow direction so as to increase an extent of liquid impact on the base, wherein a height of the channel of the liquid inlet port is higher than that of the container;
   an actuator for urging circulation of said liquid in the liquid cooling device;
   pipes connecting the container and actuator via the liquid inlet port and liquid outlet port to establish the circulation of the liquid, and
   a radiator located in the circulation of the liquid for removing heat from the liquid passing through the radiator.

2. The liquid cooling device of claim 1, wherein the radiuses of the funnel-shaped channel is defined by an inner surface of the liquid inlet port in line along a liquid flow direction.

3. The liquid cooling device of claim 2, wherein the surface of the liquid inlet port is linear in an axial direction of the liquid inlet port.

4. The liquid cooling device of claim 2, wherein the surface of the liquid inlet port is curvilinear in an axial direction of the liquid inlet port.

5. The liquid cooling device of claim 4, wherein the inner surface of the liquid inlet port is concave.

6. The liquid cooling device of claim 1, wherein the liquid inlet port is formed at the lid.

7. The liquid cooling device of claim 6, wherein the liquid inlet port is formed at a middle of the lid.

8. A liquid cooling device comprising:
   a container having a base having a portion adapted for contacting with a heat-generating electronic device, the container containing liquid therein;
   a liquid inlet through which the liquid enters the container, a channel of the liquid inlet being so configured that the liquid becomes a shooting flow when the liquid enters the container through the liquid inlet, the channel having a bore size varied along a length thereof, wherein the channel has the smallest bore size at a part thereof close to the base;
   a liquid outlet through which the liquid leaves the container;
   a hermetical liquid circulation loop connecting the liquid inlet and liquid outlet;
   an actuator for driving the liquid to flow in the liquid circulation loop; and
   a radiator for removing heat in the liquid when the liquid flows through the radiator;
   wherein the channel of the liquid inlet is funnel-shaped having radiuses gradually descended along a liquid flow direction, the liquid inlet is located at a top wall of the container corresponding to a middle portion of the base, and the liquid outlet is also located at the top wall of the container.

9. The liquid cooling device of claim 8, wherein a surface of the funnel-shaped channel is curvilinear in an axial direction of the liquid inlet.

10. The liquid cooling device of claim 8, wherein the liquid inlet is located corresponding to a middle portion of the base, and the liquid inlet is located at a top wall of the container.

11. The liquid cooling device of claim 10, wherein the liquid outlet is located at the top wall of the container.

12. The liquid cooling device of claim 11, wherein the liquid inlet has a height higher than that of the container.

13. The liquid cooling device of claim 8, wherein the liquid inlet has a height which is higher than that of the container.

* * * * *